(12) United States Patent
Furumiya

(10) Patent No.: US 6,441,853 B1
(45) Date of Patent: Aug. 27, 2002

(54) SOLID-STATE IMAGE SENSOR HAVING VERTICAL TRANSFER ELECTRODES PROTECTED FROM SHORT CIRCUITING

(75) Inventor: Masayuki Furumiya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/102,566

(22) Filed: Jun. 23, 1998

(30) Foreign Application Priority Data

Jun. 23, 1997 (JP) .............................................. 9-165802

(51) Int. Cl.$^7$ ................................................ H04N 5/335
(52) U.S. Cl. ...................................... 348/311; 257/232
(58) Field of Search ................................. 348/294, 311, 348/312, 315, 316; 257/232, 226, 231, 215, 288, 222; H04N 5/335

(56) References Cited

U.S. PATENT DOCUMENTS 6,215,521 B1 * 4/2001 Surisawa et al. ........... 348/314

6,278,487 B1 * 8/2001 Nakashiba .................. 348/314

FOREIGN PATENT DOCUMENTS

JP 4-19752 3/1992

* cited by examiner

*Primary Examiner*—Tuan Ho
(74) *Attorney, Agent, or Firm*—Sughrue Mion, PLLC

(57) ABSTRACT

A CCD image sensor comprises an active area having an array of photodetectors, a vertical CCD, a horizontal CCD and an output section, and a field area wherein vertical transfer electrodes of the vertical CCD are connected to respective vertical bus lines. The vertical electrodes are implemented by three-layer firms for transferring the signal charge. The first electrode implemented by the first layer film protrudes from the second and third electrodes implemented by the second layer film in the field area. A short-circuit failure occurring between the second electrode and the third electrode along the side-wall of the first electrodes in the field area is prevented due to a large distance between the second electrode and the third electrode along the surface of the side-wall of the first electrode.

5 Claims, 12 Drawing Sheets

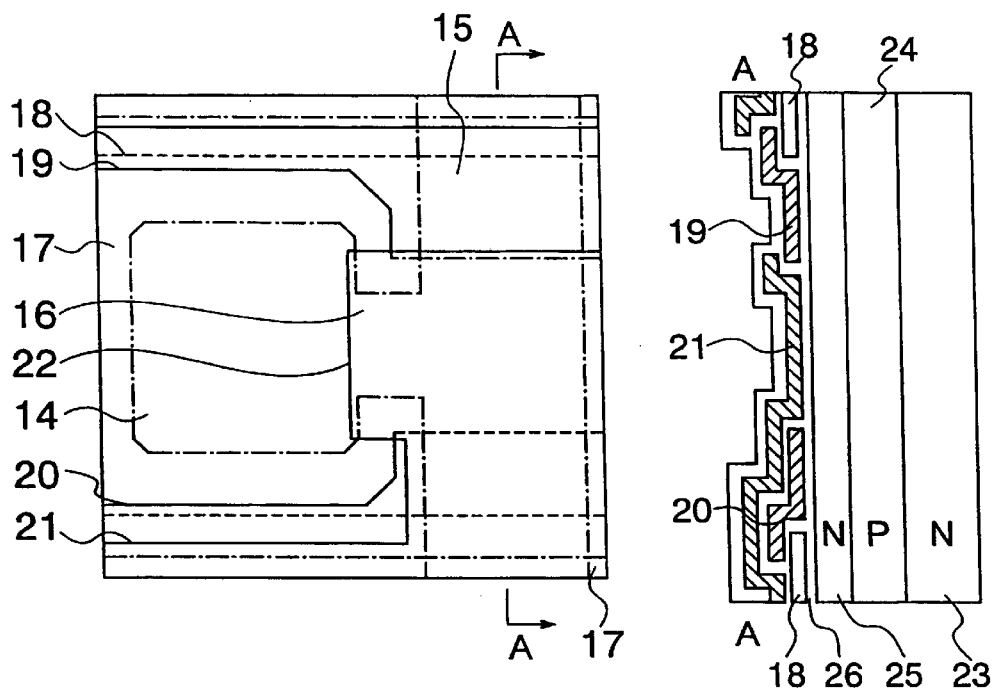
FIG. 2 PRIOR ART   FIG. 2A PRIOR ART
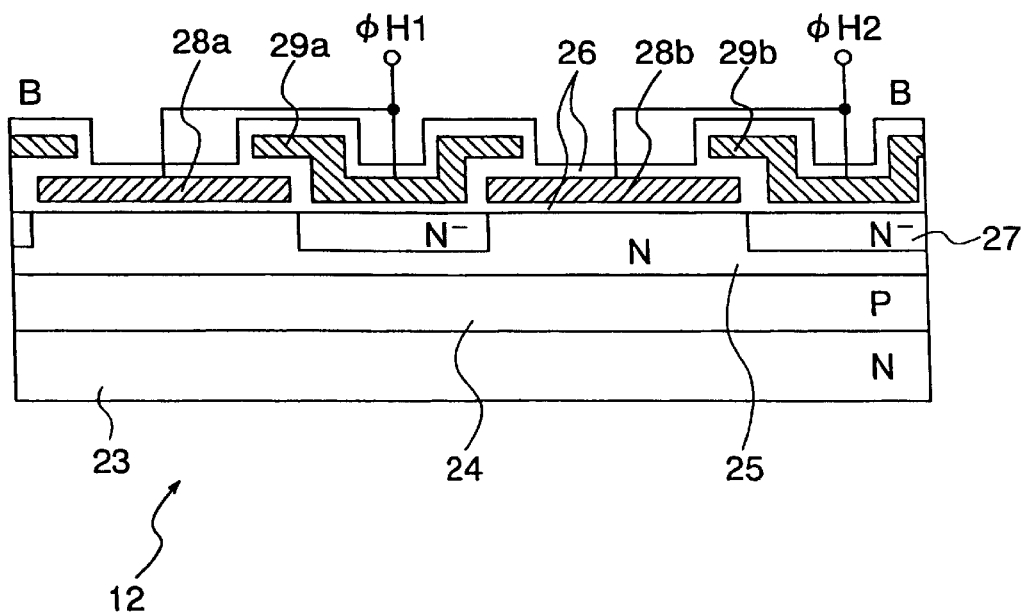
FIG. 3 PRIOR ART

IMAGING REGION 11 (ACTINE AREA)
WIRING REGION 10 (FIELD AREA)

IMAGING REGION 11 | WIRING REGION 10

IMAGING REGION | WIRING REGION 10

SOLID-STATE IMAGE SENSOR HAVING VERTICAL TRANSFER ELECTRODES PROTECTED FROM SHORT CIRCUITING

BACKGROUND OF THE INVENTION (a) Field of the Invention

The present invention relates to a solid-state image sensor and, more particularly, to an interline charge-coupled device (CCD) image sensor of a simultaneous reading type having transfer electrodes formed by three-layer conductor. The present invention also relates to a method for fabrication thereof.

(b) Description of the Related Art

Recently, video cameras comprising solid-state image sensor are widely used for business or home use. These conventional video cameras have generally adopted an interlace scanning system which scans every other horizontal signal line during a single frame corresponding to a television system (for instance, NTSC system and PAL system). On the other hand, image pick-up cameras for personal computers, developed actively in recent years, use a simultaneous reading scheme which simultaneously reads all the pixels of the image sensor, from the viewpoint of obtaining a high resolution still picture and easiness of output to the displays. This system is called simultaneous reading system, sequential scanning system, non-interlacing scanning system or progressive scanning system. The solid-state image sensor of the simultaneous reading type reads out signal charge from all of the pixels simultaneously and independently. A typical solid-state image sensor of the simultaneous reading type is more specifically described in the followings.

FIG. 1 is a top plan view of an active area of a conventional interline CCD image sensor of the simultaneous reading type. The active area of the image sensor comprises a imaging region 11, a horizontal CCD 12, and an output section (or charge detecting section) 13. Imaging region 11 comprises a plurality of photodiodes 14 arranged in a two-dimensional matrix for accumulating therein signal charge obtained by photoelectric conversion, and a vertical CCD 15 disposed between adjacent columns of photodiodes 14 for transferring the signal charge in the vertical direction. A transfer gate area 16 is also disposed between a column of photodiodes 14 and a corresponding vertical CCD 15 for reading the signal charge from the column of photodiodes 14 to the vertical CCD 15. The rest of the imaging region 11 is formed as an element isolation region 17.

In operation, the signal charge, obtained by photoelectric conversion in each photodiode 14 and accumulated therein within a certain period of time, is read out to vertical CCD 15 through transfer gate area 16. The signal charge read out from each horizontal line of photodiodes toward respective vertical CCDs 15 is transferred therein toward a horizontal CCD 12 in the active area step by step using a driving signal. The signal charge transferred to horizontal CCD 12 is then transferred in the horizontal direction toward output section 13 for detection of a two-dimensional image.

FIG. 2 is a top plane view of one of the pixels in a typical image sensor of the simultaneous reading type, and FIG. 2A is a cross-sectional view of the pixel taken along line A—A in FIG. 2. The pixel comprises photodiode 14, vertical CCD 15, transfer gate area 16 and element isolation region 17. Vertical CCD 15 comprises a channel and four associated vertical transfer electrodes 18 to 21. At least one of the four vertical transfer electrodes 18 to 21, for example, vertical transfer electrode 22 has an additional function as a reading electrode for reading the signal charge from photodiode 14 to vertical CCD 15.

Vertical transfer electrodes 18 to 21 are formed by three layers of polysilicon. The three-layer polysilicon films are consecutively referred to as a first layer polysilicon film, a second layer polysilicon film, and a third layer polysilicon film from the bottom to the top in this text. Vertical transfer electrode 18 formed by the first layer polysilicon film and shown by a dotted line extends in the horizontal direction as viewed in the drawing. Namely, vertical transfer electrode 18 extends in the imaging region across element isolation region 17 which separates adjacent photodiodes in the vertical direction. Vertical transfer electrodes 19 and 20 formed by the second layer polysilicon film extend in the horizontal direction in the imaging region, overlying the side-wall of vertical transfer electrode 18. Vertical transfer electrode 21 formed by the third layer polysilicon film overlies a portion of the vertical CCD channel not covered by vertical transfer electrodes 18, 19 and 20, and extends in the horizontal direction in the imaging region, overlying vertical transfer electrode 18.

As shown in FIG. 2A, a P-well 24 is formed on the main surface of an N-type silicon substrate 23, and an N-type buried layer 25 is formed thereon. Vertical transfer electrode 18 is formed thereon with an intervention of a first isolation film 26, vertical transfer electrodes 19 and 20 are formed thereon with an intervention of a second insulation film 26, and vertical transfer electrode 21 is formed thereon with an intervention of a third isolation film 26. These vertical electrodes formed by three layer polysilicon partly overlap one another.

FIG. 3 is a longitudinal-sectional view of horizontal CCD 12 taken along the charge transfer direction. In horizontal CCD 12, P-well 24 is formed on the main surface of N-type silicon substrate 23, and N-type buried layer 25 constituting a transfer channel and including N⁻regions 27 is formed thereon. A horizontal accumulation electrode 28 made of the first layer polysilicon film and a horizontal barrier electrode 29 made of the second layer polysilicon film are consecutively overlaid thereon with an intervention of insulation films 26. Horizontal accumulation electrode 28a and a corresponding horizontal barrier electrode 29a are electrically connected together, and a horizontal accumulation electrode 28b and a corresponding horizontal barrier electrode 29b are electrically connected together. These electrodes of horizontal CCD 12 are driven by a two-phase driving signal including a pair of horizontal transfer pulse trains φH1 and φH2. N⁻-type buried layer 27 underlying horizontal barrier electrodes 29a and 29b have a lower impurity concentration and a higher electric potential for the signal charge than N-type buried layer 25 underlying horizontal accumulation electrodes 28a and 28b.

FIG. 4 is a top plan view of a boundary between the imaging region 11 and horizontal CCD 15, showing conventional technique of a connection between the vertical CCD and the horizontal CCD. The structure shown therein is disclosed in, for instance, JP-B-4(1992)-19752. The following description is made based on a exemplified structure wherein a final electrode 30 of vertical CCD is implemented by the first layer polysilicon film or first vertical electrode. Horizontal barrier electrode 29a is formed by the second layer polysilicon film to partly overlap final vertical transfer electrode 30. Although horizontal barrier electrode 29a extends toward vertical CCD 15 to overlie the side-wall of final vertical transfer electrode 30 formed on the channel of vertical CCD 15, adjacent horizontal barrier electrodes 29a corresponding to adjacent vertical CCDs 15 are separated from each other in element isolation region 17. At side-wall 31 of horizontal accumulation electrode 28a, as shown in FIG. 4, adjacent horizontal barrier electrodes 29a and 29b receiving different pulses are disposed with a distance of about 1 micrometer therebetween.

FIG. 5 is a perspective view of the vicinity of horizontal accumulation electrode 28a, as viewed in the direction of arrow "P" in FIG. 4 for showing the side-wall 31 of horizontal accumulation electrode 28a. The structure of FIG. 4 is obtained as follows.

A first layer polysilicon film is deposited and patterned for obtaining horizontal accumulation electrodes 28, followed by formation of insulation film 26 such as thermal oxide film or CVD oxide film. Subsequently, a second layer polysilicon film is deposited on the entire surface, followed by patterning thereof using a resist mask to obtain horizontal barrier electrodes 29a and 29b. During the patterning of the second layer polysilicon film, if etching residues of the second layer polysilicon film remain on side-wall 31, a short-circuit failure may occur between horizontal barrier electrodes 29a and 29b receiving different driving pulses, which results in a problem of lower fabrication yield of the image sensor.

For removing the etching residues from side-wall 31, the amount of side etching may be increased. However, increase in the amount of side etching increases the variations of the product dimensions, which may cause variations in the transfer characteristics of the CCD, especially in the case of a solid-state image sensor having pixel dimensions of 5×5 micrometers or smaller. In this description of the conventional technique, horizontal accumulation electrode 28a and horizontal barrier electrode 29a and 29b are formed by the first and the second layer polysilicon films, respectively. Similar problems will be involved when these electrodes are formed by the second and the third layer polysilicon films.

Another method, such as an additional etching using a resist mask having a small opening for exposing side-wall 31, may be used for removing the etching residues from side-wall 31. However, since side-wall 31 is disposed in the active area, wherein the insulation films having a thickness as low as several dozens of micrometers are formed, device characteristics may be degraded by the etching damage. In addition, it is not preferable to increase the number of photolithographic steps. Even if the additional etching on the element isolation region does not degrades the device characteristics, it is not easy to form a resist mark having a small opening as low as 1 micrometer wide or less without an offset.

SUMMARY OF THE INVENTION

It is therefore an object of the present invention to provide a solid-state image sensor having improved device characteristics and capable of being fabricated with an improved fabrication yield. It is another object of the present invention to provide a method for fabricating the solid-state image sensor.

The present invention provides, in a first aspect thereof, a charge-coupled device (CCD) image sensor comprising an active area and a field area, the active area receiving therein an array of photodiodes arranged in a two-dimensional matrix, a vertical CCD for transferring therein signal charge transferred from each column of the photodiodes, a horizontal CCD for transferring the signal charge transferred by the vertical CCD, and an output section for detecting the signal charge transferred by the horizontal CCD to output a two-dimensional image, the vertical CCD having a transfer channel and a plurality of associated vertical transfer electrodes for receiving a driving signal including a plurality of pulse trains, the field area receiving therein a plurality of bus lines corresponding to the vertical transfer electrodes, the vertical transfer electrodes being implemented by a plurality of conductive films including a first layer film and a second layer film, the second layer film covering substantially an entire side wall of the first layer film in the active area, the first layer film protruding from the second and third layer films in the field area.

The present invention also provides, in a second aspect thereof, a method for fabricating the CCD image sensor as described above. The method comprises the steps of etching said second layer film using a first resist mask and additionally etching residues of said second layer film by using a second resist mask having an opening exposing a portion of said first layer film not covered by said second layer film in said field area.

In accordance with the CCD image sensor according to the present invention, a short circuit failure occurring between the electrodes formed by the second layer film along the surface of side-wall of the first layer film can be prevented by preventing the etching residues of the second layer film remaining on the first layer film or providing a large distance between the electrodes formed by the second layer film along the surface of the side-wall of the first layer film.

The above and other objects, features and advantages of the present invention will be more apparent from the following description, referring to the accompanying drawings.

BRIEF DESCRIPTION OF THE DRAWINGS

FIG. 2 is a top plan view of a pixel in the typical image sensor of FIG. 1, and FIG. 2A is a sectional view taken along line A—A in FIG. 2;

FIG. 3 is a sectional view of the horizontal CCD shown in FIG. 1 taken in the direction of charge transfer;

PREFERRED EMBODIMENT OF THE INVENTION

Figure 1:
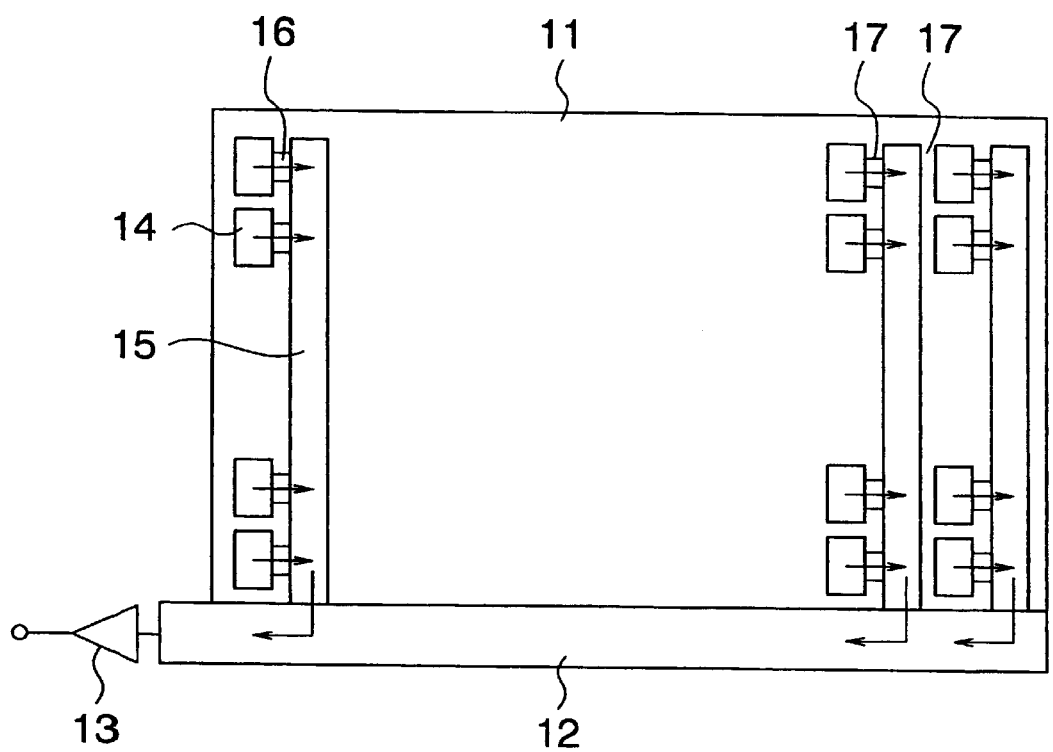
FIG. 1 is a top plan view of an active area of a typical interline CCD image sensor of a simultaneous reading type.
Figure 4:
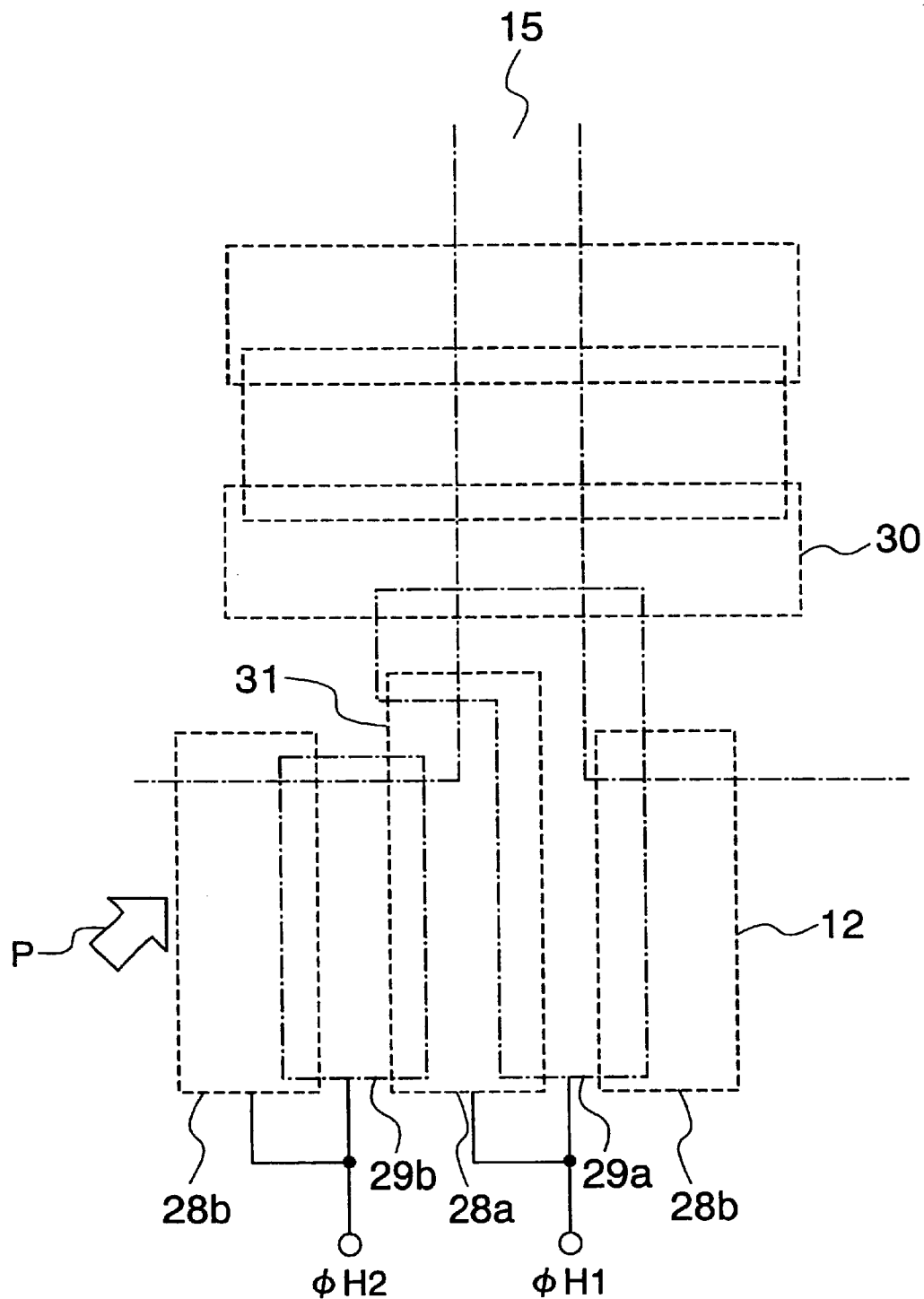
FIG. 4 is a detailed top plan view of the connection between vertical CCD and the horizontal CCD shown in FIG. 1.
Figure 5:
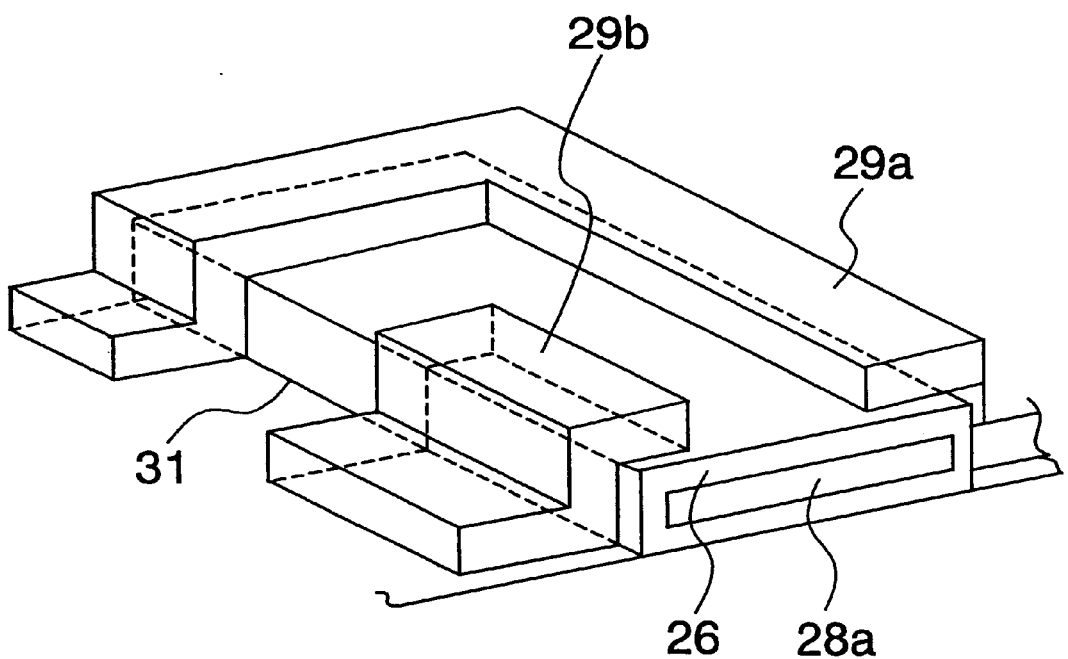
FIG. 5 is a perspective view of the vertical CCD and the horizontal CCD as viewed along arrow P in FIG. 4.

Now, the present invention is more specifically described based on a preferred embodiment thereof with reference to the accompanying drawings, wherein similar constituent elements are designated by same or similar reference numerals throughout the drawings.

A CCD image sensor according to an embodiment of the present invention has a configuration similar to that described with reference to FIGS. 1 to 3 in connection with the typical CCD image sensor, and the description of the similar constituent elements are omitted herein for avoiding a duplication.

Figure 6:
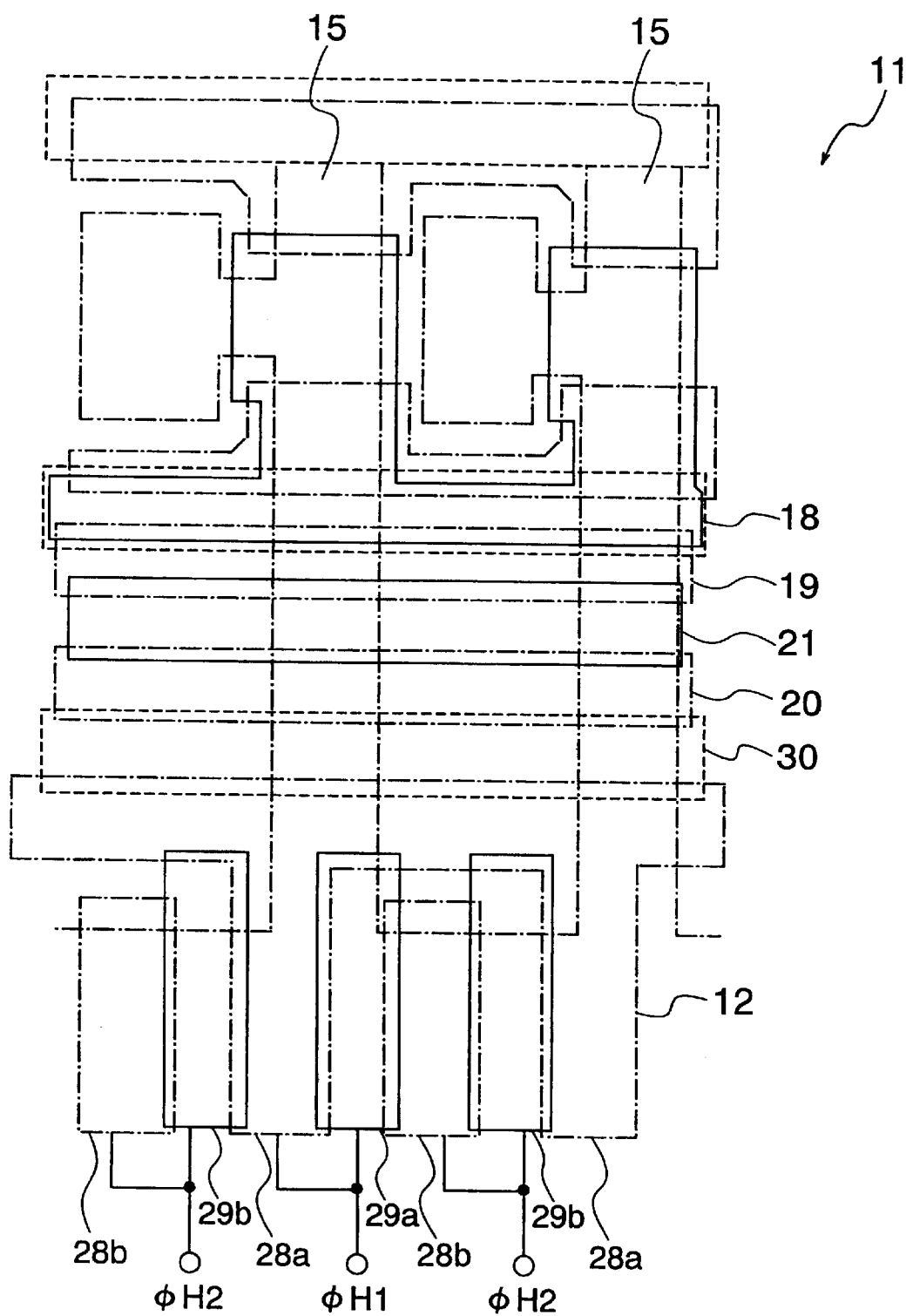
FIG. 6 is a top plan view of a portion of the active area, showing a connection between vertical CCD and horizontal CCD of a CCD image sensor according to an embodiment of the present invention.

Referring to FIG. 6 showing, similarly to FIG. 2, the connection between the vertical CCD and the horizontal CCD in the active area of the image sensor of the present embodiment, vertical transfer electrodes 18 to 21 are formed by three-layer polysilicon films. Vertical transfer electrode 18 shown by a dotted line in the figure is formed by the first layer polysilicon film, vertical transfer electrodes 19 and 20 shown by chain lines are formed by the second layer polysilicon film, and vertical transfer electrode 21 shown by a solid line is formed by the third layer polysilicon film. Final vertical transfer electrode 30 is implemented by the first layer polysilicon film. Horizontal accumulation electrodes 28a and 28b are formed by the second layer polysilicon film, and horizontal barrier electrodes 29a and 29b are formed by the third layer polysilicon film.

It is to be noted that, in the active area of the image sensor, one of the side-walls of final vertical transfer electrode 30 near the horizontal CCD 12 of the image sensor is entirely covered by horizontal accumulation electrode 28a formed by the second layer polysilicon film, with an intervention of an insulation film. In addition, the other of the side-walls of final vertical transfer electrode 30 far from the horizontal CCD 12 is entirely covered by vertical transfer electrode 20 formed by the second layer polysilicon film, with an intervention of the insulation film. The configuration of the vertical transfer electrodes 18 to 21 of the vertical CCD 15 in each pixel is similar to the configuration described in connection with the conventional technique with reference to FIG. 2. The portion of the side-wall of each vertical transfer electrode 18 formed by the first layer polysilicon film for each pixel in the imaging region 11 is entirely covered by corresponding portions of vertical transfer electrodes 19 and 20 formed by the second layer polysilicon film.

In the active area, as described above, both the side-walls of the electrodes 18 formed by the first layer polysilicon film are covered by respective electrodes 19 and 20 formed by the second layer polysilicon film. Thus, the etching residues of the second layer polysilicon film is not formed or left on the side-walls of vertical transfer electrode 18 formed by the first layer polysilicon film in the active area, whereby an electric short-circuit failure is prevented in the active area between the transfer electrodes 19 and 20 formed by the second layer polysilicon film and receiving different transfer pulses.

Figure 7:
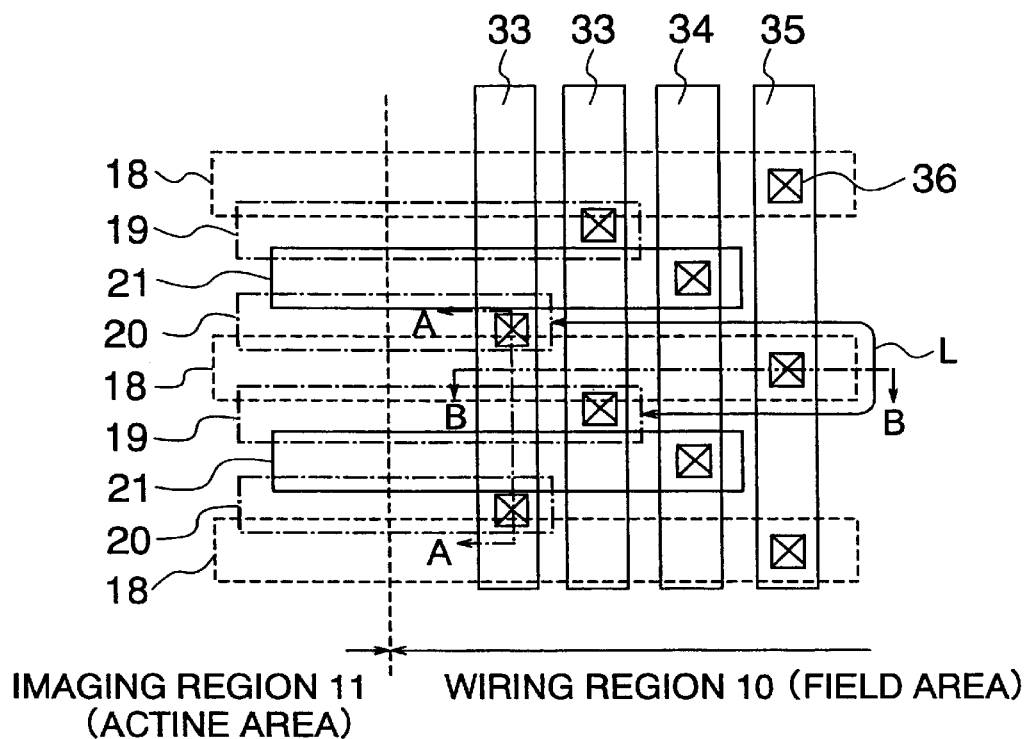
FIG. 7 is a top plan view of a boundary between the imaging region of the active area and the wiring region of the field area in the image sensor of FIG. 6, and FIGS. 7A and 7B are sectional views taken along lines A—A and B—B in FIG. 7.
Figures 7A, 7B:
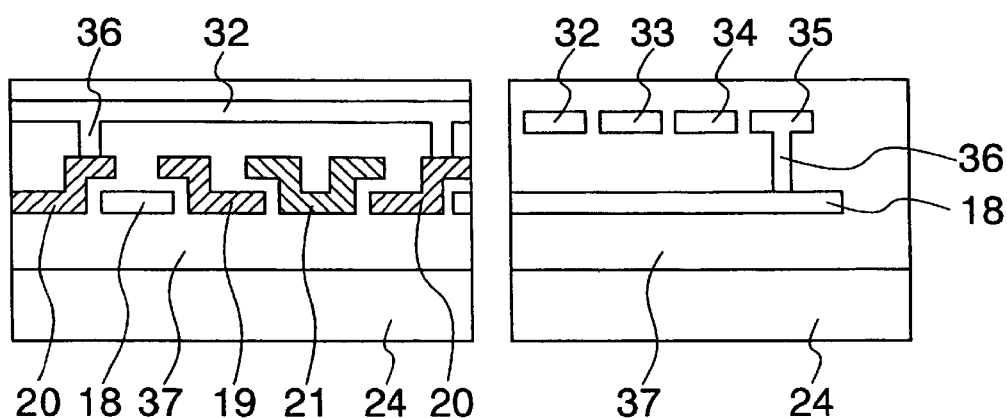

FIGS. 7, 7A and 7B show the boundary between the imaging region 11 of the active area and a wiring region 10 of the field area, depicting the configuration of nodes connecting vertical transfer electrodes 18 to 21 with respective vertical bus lines 32 to 35 in the wiring region 10 of the field area of the image sensor of FIG. 6. In the present embodiment, vertical CCD 15 is driven by a four-phase driving signal including four different vertical transfer pulse trains applied to respective vertical electrodes 18 to 21.

Transfer electrodes 18 to 21 extend from the imaging region 11 of the active area toward the wiring region 10 of the field area, wherein transfer electrodes 18 to 21 are connected to vertical bus lines 32 to 35 extending perpendicular to vertical transfer electrodes 18 to 21 through contact holes 36, as shown in FIG. 7. A thick insulation film 37 having a thickness of several hundreds of nanometers to 2 micrometers is formed as underlying vertical transfer electrode 18 to 21 in the active area, as shown in FIG. 7A. Thick insulation film 37 is formed in the wiring region 10 on the P-well 24 formed on a N-type silicon substrate not shown.

As understood from FIG. 7, the side-walls of vertical transfer electrode 18 are not entirely covered by vertical transfer electrodes 19 and 20 in the field area. In this configuration, etching residues of the second layer polysilicon film may be left along the side-walls of vertical electrode 18 formed by the first layer polysilicon film. It may be considered in this configuration that the different vertical transfer pulses applied to respective vertical transfer electrodes 19 and 20 cause a short-circuit failure therebetween.

Generally, a short-circuit failure is more likely to occur when the distance "L" measured between vertical transfer electrodes 19 and 20 along the surface of the side-walls of electrode 18 formed by the first layer polysilicon film not covered by electrodes 19 and 20 is smaller. In the present invention, for obtaining a larger distance "L", a configuration is employed wherein vertical transfer electrode 18 formed by the first layer polysilicon film extends to a far-most position, at which vertical transfer electrode 18 can be connected to vertical bus line 35 in the wiring region 10, from the imaging region 11 and wherein vertical transfer electrodes 20 and 19 formed by the second layer polysilicon film extend to the locations, at which vertical transfer electrodes 20 and 19 can be connected to vertical bus lines 32 and 33 and which are located near-most and second near-most, respectively, from the imaging region 11. The connection itself of vertical transfer electrodes 19 and 20 with vertical bus lines 32 and 33 may be reversed in order.

In the configuration of vertical transfer electrodes 18 to 20 in the wiring region 10 of the field area as described above, even if etching residues of the second layer polysilicon film are left on the side-wall of the first layer polysilicon film, the larger distance "L" prevents the occurrence of a short-circuit failure. The following description will show the numerical estimation of the advantage of the present embodiment. A general configuration of vertical transfer electrodes wherein a short-circuit failure is most likely to occur in the typical CCD image sensor is such that the vertical transfer electrode (18) formed by the first layer polysilicon film does not protrude from and is not exposed by the other vertical transfer electrodes (19 and 20) formed by the second layer polysilicon film in the field area after exiting the imaging region 11. In this case, the distance "L" for affecting the short-circuit failure is equal to the interval of the two vertical transfer electrodes 19 and 20 formed by the second layer polysilicon film overlapping vertical transfer electrode 18 formed by the first layer polysilicon film and, in general, is equal to around 1 micrometer. On the other hand, the configuration of the vertical transfer electrodes shown in FIG. 7 has a distance "L" as high as several tens of micrometers, thereby decreasing the possibility of the occurrence of a short-circuit failure down to several percentage.

If the vertical driving signal is of six-phase pulse trains or more-phase, it is also possible, by using the configuration similar to the configuration of FIG. 7, to suppress the possibility of a short-circuit failure between the vertical transfer electrodes formed by the second layer polysilicon film.

Figure 8:
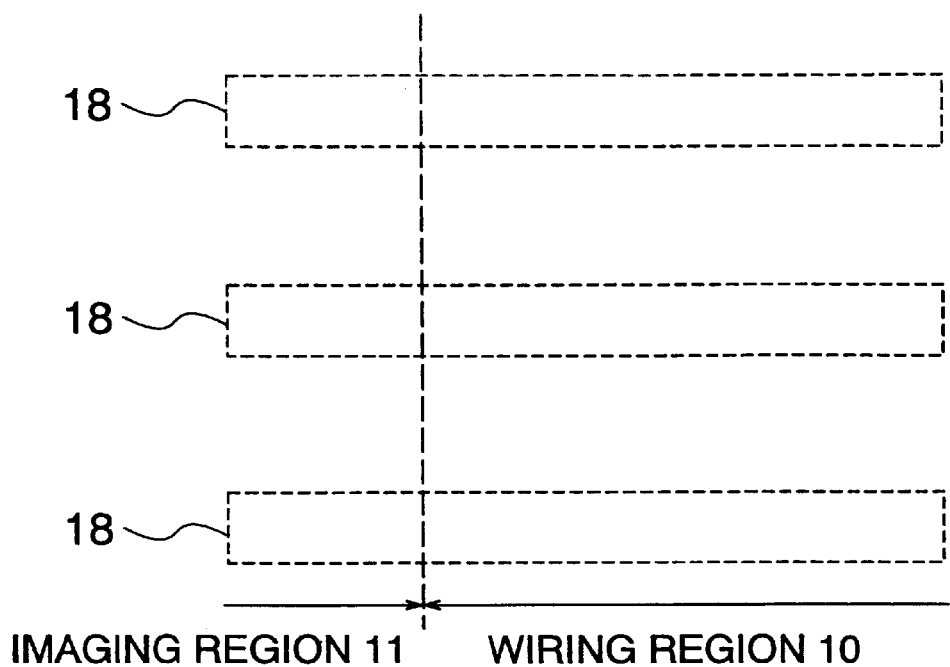
FIGS. 8 to 10, and FIGS. 13 and 14 are top plan views of the boundary shown in FIG. 7 during consecutive steps of fabrication of the image sensor of FIG. 6.
Figure 8A:
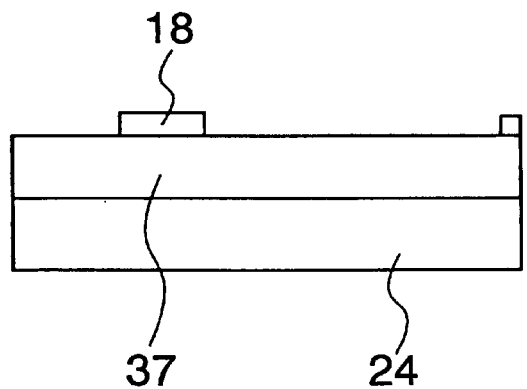
FIGS. 8A and 8B, FIGS. 9A and 9B, FIGS. 10A and 10B, FIGS. 13A and 13B and FIGS. 14A and 14B are sectional views taken along lines A—A and B—B in FIG. 7 during the fabrication steps of FIGS. 8, 9, 10, 13 and 14, respectively.
Figure 8B:
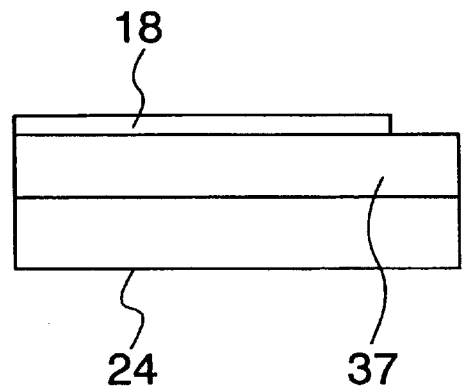

FIGS. 8 to 14 show top plan views of a portion of the image sensor of FIG. 7 in consecutive steps of fabrication thereof. FIGS. 8A and 8B are sectional views taken from the configuration of FIG. 8 along lines A—A and B—B shown in FIG. 7, FIGS. 9A and 9B, FIGS. 10A and 10B, FIGS. 13A and 13B and FIGS. 14A and 14B are similar sectional views taken from the configuration of FIGS. 9, 10, 13 and 14, respectively.

In fabrication of the configuration of FIG. 7, P-well 24 is first formed on a silicon substrate not shown, followed by formation of thick insulation film 37 made of silicon oxide or nitride. After forming the first layer polysilicon film on the entire surface of thick oxide film 37, etching is performed using a resist mask, not shown in the figure, to form vertical transfer electrodes 18, as shown in FIGS. 8, 8A and 8B.

Figure 9:
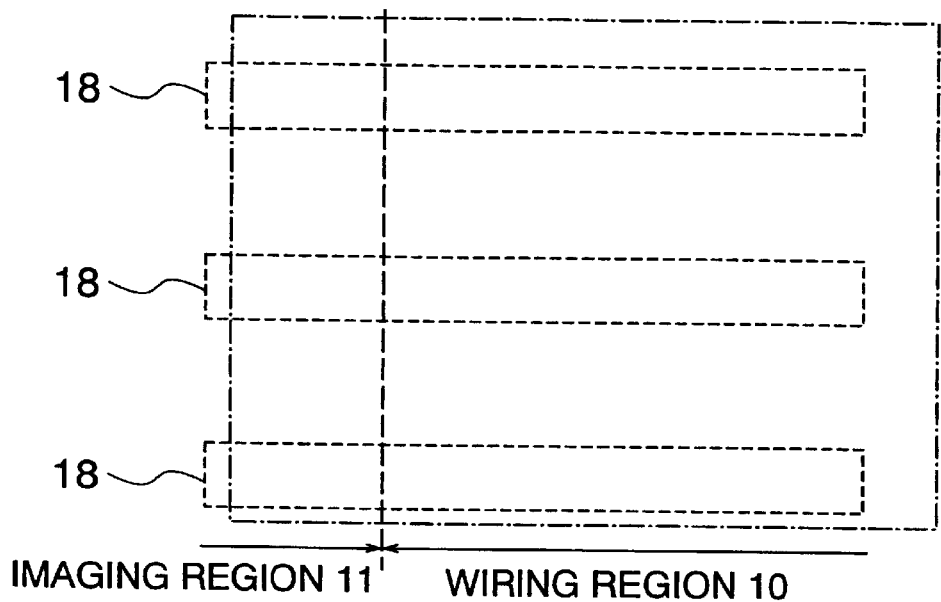
Figures 9A, 9B:
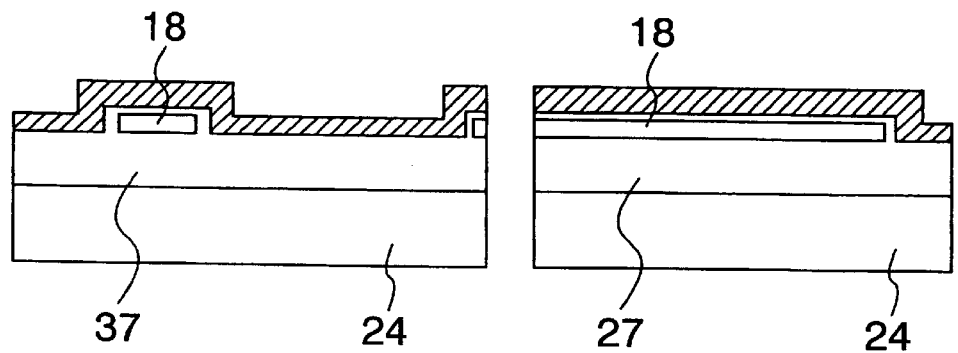
Figure 10:
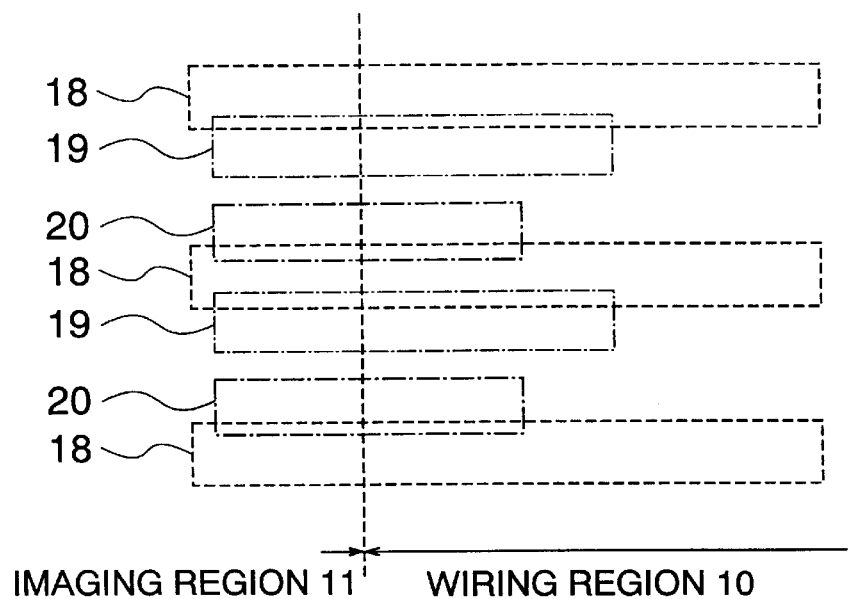
Figures 10A, 10B:
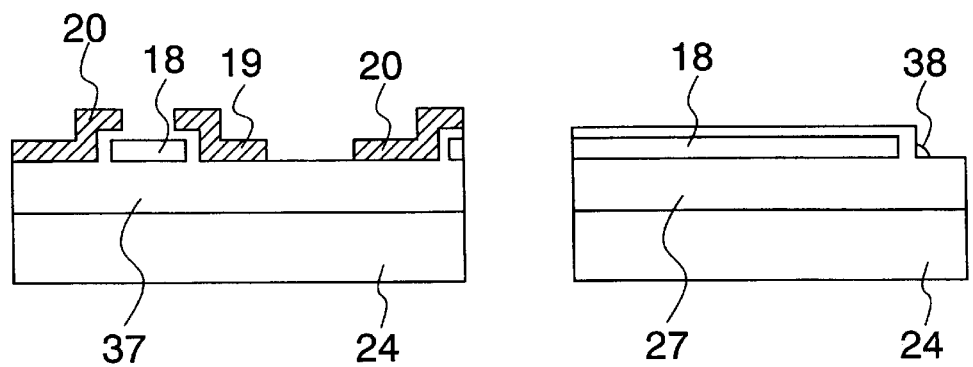

Subsequently, another insulation film is formed by thermal oxidation or CVD (chemical vapor deposition) to cover vertical transfer electrode 18. Second layer polysilicon film 40 is then formed on the entire surface, as shown in FIGS. 9, 9A and 9B, followed by etching thereof using a resist mask, not shown in the figure, to form vertical transfer electrodes 19 and 20 each having an edge overlying the edge of the vertical transfer electrodes 18, as shown in FIGS. 10, 10A and 10B. If the etching is insufficient, etching residues 38 of the second layer polysilicon film may be left on the side-walls of the first layer polysilicon film.

Figure 11:
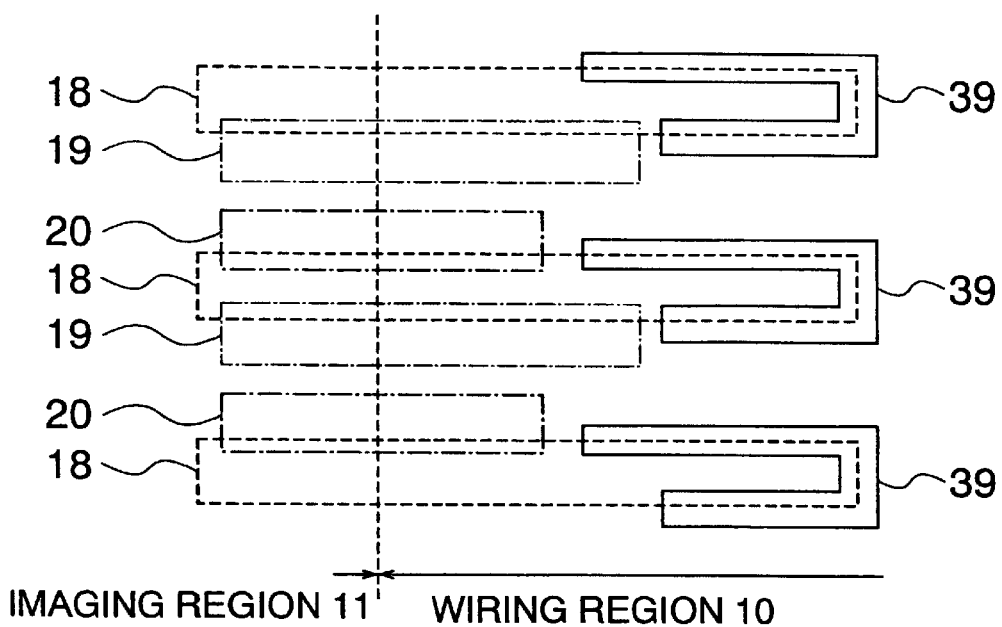
FIG. 11 is a top plan view of a mask pattern for the field area used in the fabrication of the image sensor of FIG. 7.
Figure 12:
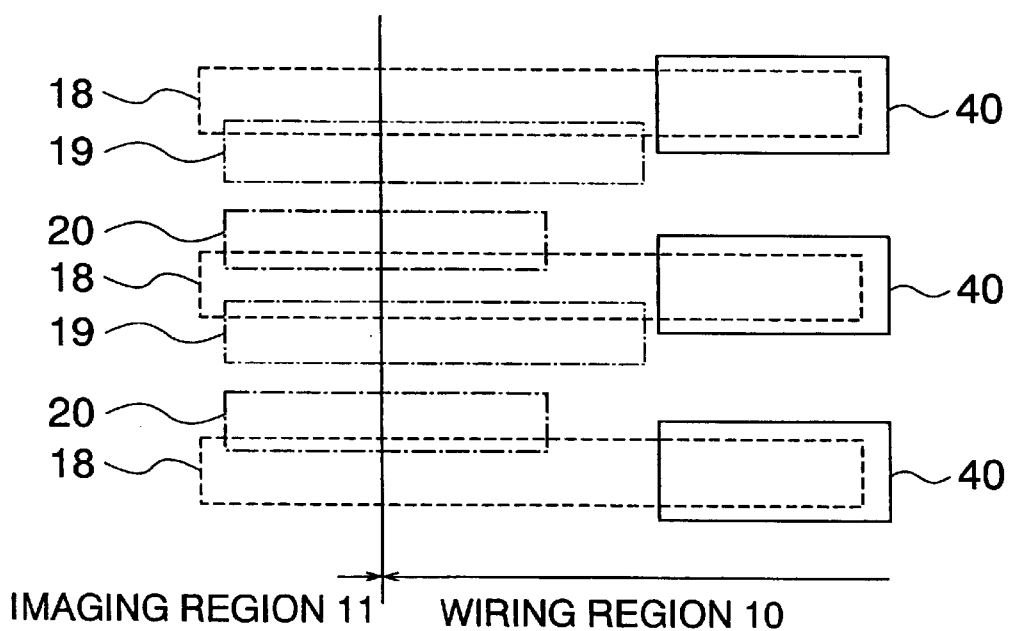
FIG. 12 is a top plan view of another mask pattern for the field area used in the fabrication of the image sensor of FIG. 7.

An additional etching is then conducted using another resist mask having an opening for exposing the edge, or the vicinity of the side-walls, of the first layer polysilicon film to remove the etching residues 38. The another resist mask used at this stage has an elongate opening 39 extending along the side-walls of the first layer polysilicon film, as shown in FIG. 11. Or alternatively, the another resist mask may have a rectangular opening 40 for exposing the end portion, or top and the side-walls of the exposed portion, of the first layer polysilicon film 18, such as shown in FIG. 12.

Figure 13:
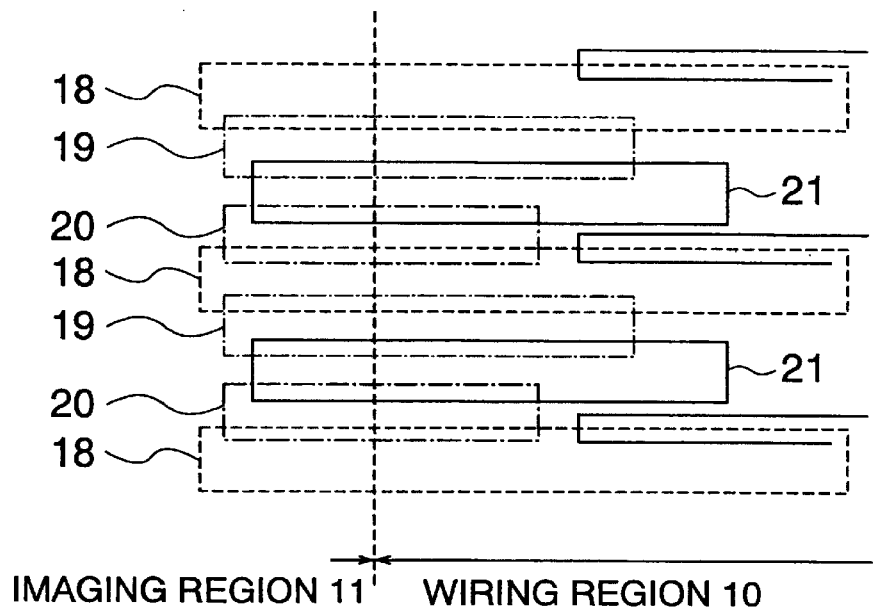
Figures 13A, 13B:
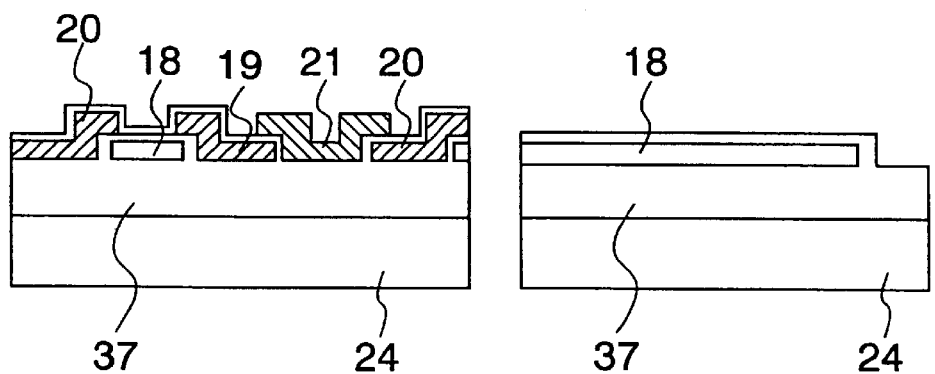
Figure 14:
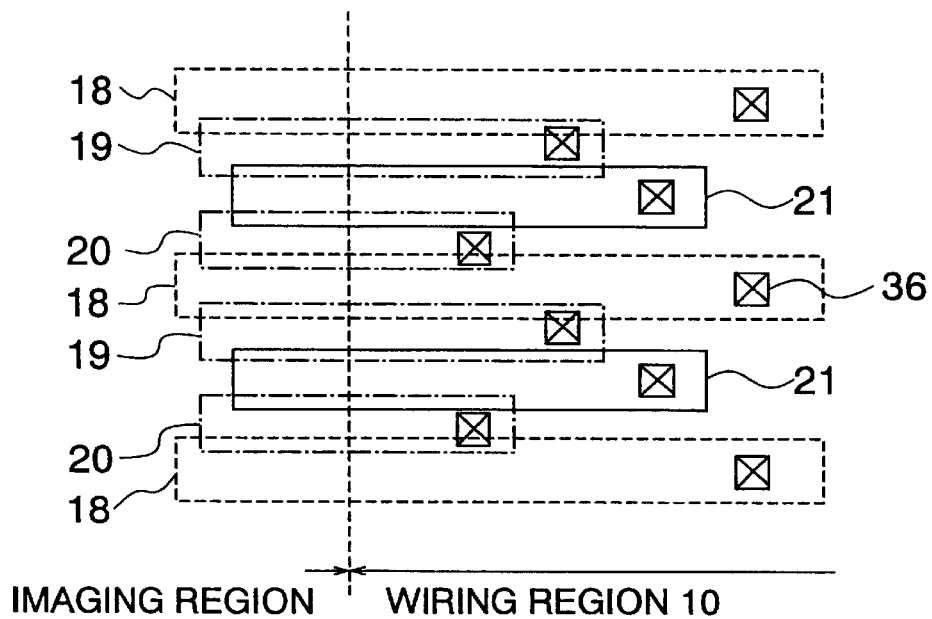
Figures 14A, 14B:
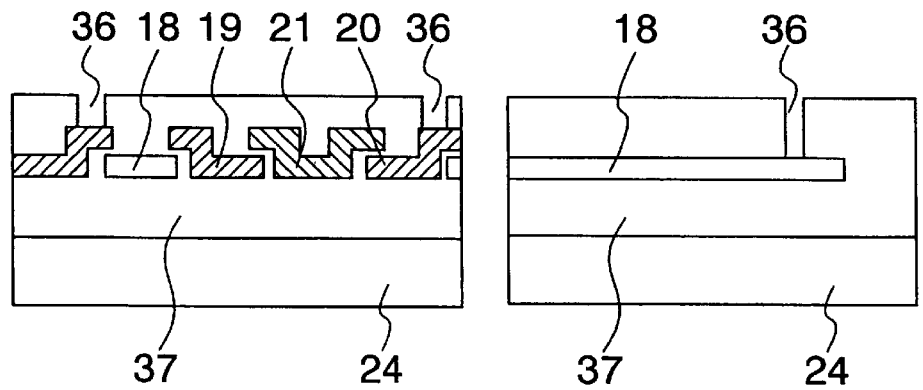

Subsequently, another insulation film is formed by thermal oxidation or CVD to cover vertical transfer electrodes 18, 19 and 20. After forming a third layer polysilicon film on the entire surface, etching is conducted using another resist mask, not shown in the figure, to form vertical transfer electrode 21, as shown in FIG. 13. Thereafter, another insulation film is formed by CVD, followed by dry etching thereof using another resist mask, not shown in the figure, to form contact holes 36, as shown in FIGS. 14, 14A and 14B. Subsequently, as shown in FIGS. 7, 7A and 7B, vertical bus lines 32 to 35 made of a metal such as aluminum or tungsten are formed thereon, followed by formation of a passivation film, not shown in the figure, made of silicon oxide or silicon nitride to finish a solid-state image sensor.

As described above, even if etching residues of the second layer polysilicon film are left on the side-walls of the first layer polysilicon film, the etching residues can be substantially entirely removed by the additional etching to prevent a short-circuit failure. The resist mask pattern used for the additional etching can be formed in a dimension on the order of several micrometers or more, thereby rendering an extremely accurate alignment of the resist mask unnecessary. Moreover, the additional etching does not deteriorate device characteristics due to the thick insulation film formed in the field area.

Since the above embodiments are described only for examples, the present invention is not limited to the above embodiments and various modifications or alterations can be easily made therefrom by those skilled in the art without departing from the scope of the present invention.

What is claimed is:

1. A charge-coupled device (CCD) image sensor comprising:

an active area and a field area, said active area receiving therein an array of photodiodes arranged in a two-dimensional matrix;

a vertical CCD for transferring therein signal charge transferred from each column of said photodiodes;

a horizontal CCD for transferring the signal charge transferred by said vertical CCD; and an output section for detecting the signal charge transferred by said horizontal CCD to output a two-dimensional image, said vertical CCD comprising a transfer channel and a plurality of associated vertical transfer electrodes for receiving a driving signal including a plurality of pulse trains, and field area receiving therein a plurality of bus lines corresponding to said vertical transfer electrodes, said vertical transfer electrodes being formed by a plurality of conductive films including a first layer film, a second layer film and a third layer film, said second layer film covering substantially an entire side wall of said first layer film in said active area, said first layer film protruding from said second and third layer films in said field area.

2. A CCD image sensor as defined in claim 1, wherein said vertical transfer electrodes include first through fourth electrodes in a cyclic order, said first electrode being implemented by said first layer film, said second and third electrodes being implemented by said second layer film, said fourth electrode being implemented by said third layer film.

3. A CCD image sensor as defined in claim 2, wherein said first electrode constitutes a final electrode in said vertical CCD.

4. A method for fabricating the CCD image sensor as defined in claim 1, comprising the steps of etching said second layer film using a first resist mask and additionally etching residues of said second layer film by using a second resist mask having an opening exposing a portion of said first layer film not covered by said second layer film in said field area.

5. A method as defined in claim 4, wherein said opening extends along a side-wall of said first electrode.

* * * * *